(12) United States Patent  
Lyford (10) Patent No.: US 6,636,058 B2  
(45) Date of Patent: Oct. 21, 2003

(54) ADAPTER FOR A MULTI-CHANNEL, LOW INPUT CAPACITANCE SIGNAL PROBE

(75) Inventor: J. Steve Lyford, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/021,143

(22) Filed: Dec. 12, 2001

(65) Prior Publication Data

US 2003/0107389 A1 Jun. 12, 2003

(51) Int. Cl.⁷ .............................................. G01R 31/02
(52) U.S. Cl. ...................................... 324/754; 439/638
(58) Field of Search ............................... 324/72.5, 754, 324/758, 761, 762, 158.1; 439/65, 76.1, 79, 362, 638

(56) References Cited

U.S. PATENT DOCUMENTS

| 5,119,020 A | * | 6/1992 | Massey et al. ............... 324/754 |
| 5,134,364 A | | 7/1992 | Karpman |
| 5,174,765 A | | 12/1992 | Williams |
| 5,228,189 A | | 7/1993 | Driller |
| 6,007,357 A | | 12/1999 | Perino |
| 6,343,957 B1 | * | 2/2002 | Kuo et al. ................... 439/638 |
| 6,364,713 B1 | * | 4/2002 | Kuo ............................ 439/638 |
| 6,447,339 B1 | * | 9/2002 | Reed et al. ................. 439/638 |

* cited by examiner

Primary Examiner—Kamand Cuneo  
Assistant Examiner—Minh N. Tang  
(74) Attorney, Agent, or Firm—William K. Bucher (57) ABSTRACT

An adapter for a multi-channel, low input capacitance signal probe head has a housing with a cavity formed therein that receives one of a mating plug or receptacle portion of multi-channel, controlled impedance connector. The housing has probe head retention members formed in the sidewalls and alignment flanges disposed adjacent to the probe head retention members that are received in the signal probe head. The adapter includes a substrate having first and second arrays of contact pads formed on the respective top and bottom surfaces of the substrate. The first array of contact pads mate with electrically conductive elastomer signal contacts of the signal probe head and the second array of contact pads mate with the contact pads of the transmission lines of the plug or receptacle. Screws extend through bores in the signal probe head and engage threaded pins in the retention members.

4 Claims, 7 Drawing Sheets

ADAPTER FOR A MULTI-CHANNEL, LOW INPUT CAPACITANCE SIGNAL PROBE

BACKGROUND OF THE INVENTION

The present invention relates generally to signal probe adapters and more particularly to a adapter for connecting multi-channel, low input capacitance signal probes of a measurement test instrument, such as logic analyzers and the like, to multi-channel controlled impedance connector mounted on a device under test.

Logic analyzers have long been used to acquire multiple signals from a device under test to analyze and verify timing, detect glitches, and the like. Multi-channel signal probes couple signals to the device under test from the instrument and from the device under test to the instrument. Various types of connectors are provided on the device under test, such as a microprocessor mother board, for connecting the signal probes to the device being tested. Rows of square pin connectors have traditionally been used as the interface contacts between the device under test and the probes.

The increased speed of digital circuitry requires the use of connectors having high speed, controlled impedance transmission lines. One such connector is called a mictor connector, manufactured by Tyco Electronics, Corp., Harrisburg, Pa. A mictor connector is a high speed, controlled impedance connector having a plug and closely mating receptacle. Each plug and receptacle portion is configured for either 0.025 inch or 0.050 inch center line spacing of transmission lines and contain from 38 to 266 lines. The transmission lines are aligned in parallel rows on either side of center power ground connector. The center ground connector in the plug is a corrugated planar structure that mates with vertically positioned ground leads in the receptacle. The transmission lines in the plug and receptacle are contained in mating housings. Mictor connectors have both vertically and horizontally mounted plugs and receptacles. The ends of the transmission lines extending from the bottom of the vertically mounted plug or receptacle are bent at an angle to form contact pads for soldering to contact pads on the surface of a circuit board or the like. The ends of the transmission lines of the horizontally mounted plug or receptacle extend directly outward from the bottom of the plug or receptacle for soldering to contact pads formed on opposing surfaces of the circuit board or the like at the edge of the board. The ends of the transmission lines at the other end of the housing of the plug or receptacle form electrical contacts that mate with each other when the closely mating plug and receptacle are connected together. In logic analyzer probing applications, a 38 pin mictor connector is most often used. Up to 38 circuit board runs of the device under test are laid out in pattern that terminate in a pattern corresponding to the pattern of the pins on the mictor connectors. The mictor receptacle is soldered to conductive pads that terminate the runs. In most probing applications of microprocessor boards, multiple mictor connectors are mounted on the circuit board. The multi-channel logic analyzer probe head has the mating mictor plug. The transmission lines of the mictor plug are electrically coupled to center conductors of a multiple coaxial cable type ribbon cable. Electrical elements, such as resistors, may be included in the probe head to provide electrical isolation for the device under test.

The P6434 34-channel high density probe, manufactured and sold by Tektronix, Inc., Beaverton, Oreg., for use with the TLA family of logic analyzers is an example of a logic analyzer probe using mictor connectors. The P6434 probe head uses an edge mounted mictor connector that is soldered to contact pads on opposing sides of a circuit board. The circuit board has an additional row of interconnect contact pads formed on each opposing side of the circuit board that are electrically connected via conductive runs to the soldered contact pads of the mictor connector. The mictor connector and circuit board are inserted into a holder that also receives two probe cables. The probe cables are ribbon type cables having multiple lead wires. The lead wires of each probe cable are soldered to contact pads of a circuit board. The contact pads are electrically connected via conductive runs to another set of contact pads that match the interconnect contact pads of the mictor connector circuit board. The conductive runs preferably include resistive elements. The probe cable circuit boards are positioned on the mictor connector circuit board with electrically conductive elastomer contacts electrically connecting the contact pads on the probe cable circuit board to the interconnect contact pads of the mictor connector circuit board. The circuit boards and the mictor connector are secured in place in a housing made of opposing half shells that are screwed together.

There are drawbacks to using mictor connectors and similar type connectors, such as Samtec connectors, for high speed probing applications. The transmission lines of the mictor connector adds capacitive loading to the device under test which affects the fidelity of the signal being acquired. The input capacitance of the mictor connector/probe head combination can be in the range of 2 to 2.5 picofarads. The mictor connectors are permanently mounted on the circuit board, which increases the cost of board, especially when multiple mictor connectors are used. Additionally, the complexity of the device under test board layout is increased because of the need to layout trace runs to each of the mictor connector, which may result in sacrificing board space that may otherwise be used for component layout.

What is needed is a multi-channel, low input capacitance signal probe head for devices under test that reduces the capacitive loading associated with previous types of probe heads using existing high density connectors. In addition, the multi-channel, low input capacitance probe head should eliminate the need for permanently mounted connectors on circuit boards of the device under test. Further, the multi-channel, low input capacitance probe head should provide flexibility in device under test board layout. There is also a need for adapters that connect existing connectors to the new multi-channel, low input capacitance signal probe head and existing multi-channel probe heads to the new connecting elements on the device under test.

SUMMARY OF THE INVENTION

Accordingly, the present invention is to an adapter for connecting a multi-channel, low input capacitance signal probe to a multi-channel controlled impedance connector mounted on a device under test. The signal probe has a signal probe head having at least a first substrate having a plurality of input signal pads formed and exposed at one end of the substrate. The substrate is positioned in a housing having at least a first open end and a substrate support member that receives the substrate such that the input signal pads are exposed at the open of the housing. A removable signal contact holder mounts to the housing and supports electrically conductive elastomer signal contacts. The holder is disposed over the open end the housing such that the elastomer signal contacts engage the input signal pads. The multi-channel low input capacitance signal probe head is preferably configured with a second substrate having a plurality of input signal pads formed and exposed at one end of the substrate. The substrate support member receives the second substrate such that the support member is disposed between the first and second substrate and the input signal pads on the second substrate are exposed at the open end of the housing.

The housing preferably has opposing sidewalls walls separated by opposing front and back walls with each sidewall having a latching recess formed therein adjacent to the open end of the housing. The housing has bores formed on either side of the substrate that are perpendicular to the open end of the housing. The housing is preferably configured with a substrate carrier and a substrate carrier cover. The substrate carrier forms the substrate support member that receives the substrate with the input signal pads on the substrate being exposed at one end of the carrier. The substrate carrier cover has exterior walls forming an interior chamber that receives the substrate carrier and substrate with the exterior walls forming the opposing sidewalls and front and back walls of the housing. The substrate carrier has opposing stiles and rails with the stiles and at least one rail having recesses formed on one surface thereof for receiving the substrate with the end of the substrate having the signal pads extending to the end of the rail having the recess. The stiles of the carrier include the housing bores. The carrier may be configured to receive a second substrate having a plurality of input signal pads thereon with the input signal pads being exposed on one end of the substrate. The stiles and the one rail have recesses formed on the reverse side thereof for receiving the second substrate with the end of the substrate having the signal pads extending to the end of the rail having the recess.

The removable signal contact holder preferably has a planar frame member and latching members extending perpendicular from either end of the frame member. At least a first slot is formed in the frame member aligned with the input signal pads on the substrate for receiving the electrically conductive elastomer signal contacts. The latching members have inwardly facing latching ramps with each latching ramp having a terminating ledge that engage the latching recesses in the housing sidewalls. At least a first alignment rib is formed parallel to the slot on the planar frame that engages a corresponding recess formed in the housing. Apertures are formed on either side of the slot that are aligned with the bores in the housing.

A probe head retention member is provided for securing the multi-channel low input capacitance signal probe head to a device under test. The device under test is preferably a circuit board having an array of signal contact pads on at least one surface thereof corresponding to the electrically conductive elastomer signal contacts. Through holes are formed on either side of the array of signal contact pads. The retention member has a first configuration with attachment members, in the form of threaded screws, extending through the bores in the housing and threadably mating with retention nuts mounted to the opposite side of the circuit board from the contact pads and aligned with the through holes. For this configuration, flanges are formed in the removable signal contact holder adjacent to the apertures and extending in a direction opposite from the latching members. The flanges engage the through holes in the circuit board to align the elastomer signal contacts with the array of signal contacts on the circuit board.

A second configuration for the retention member has attachment members, in the form of threaded screws, extending through the bores in the housing and threadably mating with threaded apertures disposed in a retention block positioned on the opposite side of the circuit board from the contact pads and aligned with the through holes in the circuit board. The retention block has alignment flanges formed adjacent to the threaded apertures that have an exterior surface closely mating with and extending through the through holes in the circuit board. The flanges preferably include latching members extending outward from the flanges to engage the top surface of the circuit board. The alignment flanges extending above the circuit board are closely received in second bores extending into the housing from the open end of the housing and coaxial with the first bores. The second bores have a diameter larger than the first bores with notches formed in the housing adjacent to the open end that closely receive in the latching members.

The retention block is preferably configured with an elongated rectangular housing having exterior walls forming an interior chamber that receives a stiffener block having the threaded apertures formed therein. The rectangular housing has alignment flanges extending from one of the exterior walls adjacent to the threaded apertures with the exterior surfaces of the flanges closely mating with and extending through the through holes in the circuit board. The alignment flanges also include latching members extending outward from the flanges to engage the top surface of the circuit board.

The multi-channel low input capacitance signal probe head is used in a multi-channel low input capacitance measurement probe for coupling a device under test having an array of signal contact pads on at least one surface of a circuit board and through holes formed on either side of the array of signal contact pads to a measurement instrument. The measurement probe has a measurement probe head with at least a first substrate having a plurality of input signal circuits and associated input signal pads formed thereon. The input signal pads are exposed on one end of the substrate and the input signal circuits are adjacent to and electrically coupled to the input signal pads. The first substrate is disposed within a housing having a substrate carrier and substrate carrier cover with the substrate carrier receiving the substrate such that the input signal pads on the substrate are exposed at one end of the carrier. The substrate carrier cover has opposing sidewalls separated by opposing front and back walls forming an open ended chamber that receives the substrate carrier and substrate such that the input signal pads are exposed at one of the open ends of the cover. Each sidewall of the cover has a latching recess formed therein adjacent to the open end of the housing. The multi-channel low input capacitance measurement probe is preferably configured with a second substrate having a plurality of input signal circuits and associated input signal pads formed thereon. The substrate carrier receives the second substrate such that the carrier is disposed between the first and second substrate and the input signal pads on the second substrate are exposed at the end of the carrier.

The probe head is secured to the device under test by a probe head retention member having bores formed through the substrate carrier on either side of the substrate that are perpendicular to the open end of the housing and aligned with the through holes in the circuit board. Attachment members extend through the bores in the substrate carrier and threadably mate with threaded apertures mounted to the opposite side of the circuit board from the contact pads and over the through holes.

A removable signal contact holder mounts over the open end of the housing. The contact holder has a planar frame member and latching members extending perpendicular from either end of the frame member. The frame member has at least a first slot aligned with the input signal pads on the substrate that receives electrically conductive elastomer signal contacts. The latching members have inwardly facing latching ramps with each latching ramp having a terminating ledge that engage the latching recesses in the housing sidewalls to mount the signal contact holder over the open end the housing such that the elastomer signal contacts engage the input signal pads. Apertures are formed on either side of the electrically conductive elastomer signal contacts that are aligned with the bores in the substrate carrier and the through holes on the circuit board. The probe head is coupled to the measurement instrument using a multiple signal lines cable having signal lines at one end electrically coupled to outputs of the input signal circuits and the other ends of the signal lines electrically coupled to an input connector that is coupled to an input connector on the measurement instrument.

A first adapter is provided to connect existing multi-channel signal probes to the signal contact pad configuration used with the multi-channel, low capacitance signal probe of the present invention. Existing multi-channel signal probes are terminated in a connector having mating plug and receptacle portions. The respective plug and receptacle portions have high speed, controlled impedance transmission lines disposed within respective housings. One end of the transmission lines form contact pads at one end of the respective housings and the other end of the transmission lines form electrical contacts at the other end of the housings. The electrical contacts engage each other on mating of the plug and receptacle. The adapter includes the other of the closely mating plug and receptacle. The contact pads of the transmission lines are affixed to a first array of contact pads formed on the top surface of a substrate. The bottom surface of the substrate has a second array of contact pads formed thereon that correspond to the signal contact pads on the circuit board of the device under test. The contact pads on the top surface are electrically coupled to corresponding contact pads on the bottom surface. A removable signal contact holder is positioned adjacent to the bottom surface of the substrate and supports electrically conductive elastomer signal contacts such that the elastomer signal contacts engage the second array of contact pads. An adapter retention member is positioned on the opposite side of the circuit board from the signal contact pads and has attachment members to secure the adapter to the circuit board.

A second adapter is provided to connect the multi-channel, low input capacitance signal probe to a plug or receptacle of a high speed, controlled impedance connector mounted to the device under test. The second adapter has a housing with opposing end walls and sidewalls forming a cavity that receives the other of the closely mating plug or receptacle. The contact pads of the transmission lines of the closely mating plug or receptacle are exposed at one end of the housing cavity and the electrical contacts of the transmission lines are exposed at the other end of the housing. The housing has probe head retention members formed in the sidewalls on either side of the cavity and alignment flanges disposed adjacent to the probe head retention members that extend upward from the sidewalls. The retention members include bores formed in the sidewalls with the bores receiving pins having a threaded aperture formed therein.

The adapter includes a substrate having apertures formed therethrough that closely receive the alignment flanges on the housing. The substrate has first and second arrays of contact pads formed on the respective top and bottom surfaces of the substrate. The first array of contact pads correspond to the electrically conductive elastomer signal contacts of the multi-channel, low input capacitance signal probe head The second array of contact pads are affixed to the corresponding contact pads of the transmission lines of the plug or receptacle. The first array of contact pads on the top surface of the substrate are electrically coupled to the corresponding second array of contact pads on the bottom surface of the substrate via conductive runs extending through the substrate.

The alignment flanges mate with corresponding bores in the multi-channel, low input capacitance signal probe head such that the signal contact pads of the multi-channel, low input capacitance signal probe head connect to corresponding contact pads on the top surface of the substrate. The threaded pins of the probe head retention members receive attachment members, such as threaded screws, disposed in the bores of the multi-channel, low input capacitance signal probe head to secure the probe head to the housing.

The objects, advantages and novel features of the present invention are apparent from the following detailed description when read in conjunction with appended claims and attached drawings.

DETAILED DESCRIPTION OF THE PREFERRED EMBODIMENT

Figure 1:
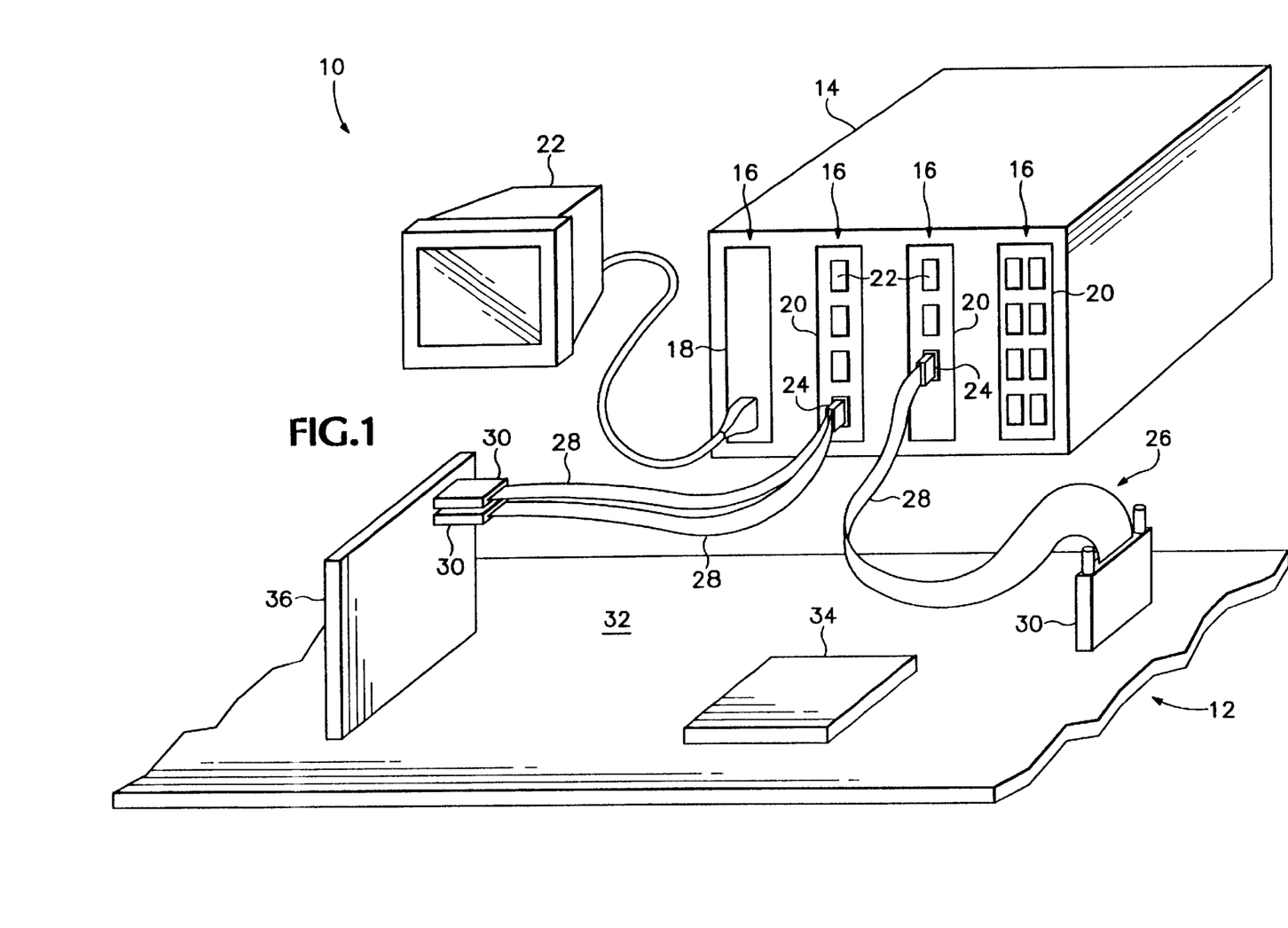
FIG. 1 is a perspective view of a measurement instrument for injecting and acquiring signals from a device under test.

Referring to FIG. 1, there is shown a perspective view of a measurement instrument 10, such as a logic analyzer, for injecting and acquiring signals from a device under test 12. The logic analyzer may be a portable stand alone instrument or a modular system with multiple mainframes. FIG. 1 shows one type of modular logic analyzer system 10 having a modular mainframe 14 with multiple slots for receiving various modules 16. The modules 16 include a controller module 18, one or more logic analyzer modules and pattern generator modules 20. An optional digital oscilloscope module may also be included in the system. The logic analyzer/ pattern generator modules 20 are configured for a number of channels, such as 34, 68 102, 136 channels. Up to 680 channels may be included in the mainframe. Multiple mainframes may be connected together to produce a system having up to 8,120 channels. The signal outputs from the mainframe are coupled to a display device 22, such as a display monitor, for viewing the acquired signals from the device under test 12.

Each module has input/output connectors 24, such as the receptacle portion of commercially available Samtec or mictor connectors. The plug portions of the samtec connectors are connected to one end of multi-channel signal probes 26. A ribbon cable 28 extend from the samtec connector end of the probe to a multi-channel, low input capacitance signal probe head 30. The multi-channel, low input capacitance signal probe head 30 is attached to signal contact pads formed on the device under test 12, such as a PC microprocessor mother board 32 containing a microprocessor 34. The device under test 12 may also include embedded controller boards, internet switches and the like. The device under test 12 may also contain connectors for receiving adapter cards 36 for testing various busses associated with the device under test 12. These busses include, but not limited to, rapid I/O bus, PCI bus, RAMBus, gigabit ethernet and the like. Three multi-channel, low input capacitance signal probe heads 30 are shown connected to the device under test 12 but it understood that any number of multi-channel probes 26 may be connected to device under test 12.

Figure 2:
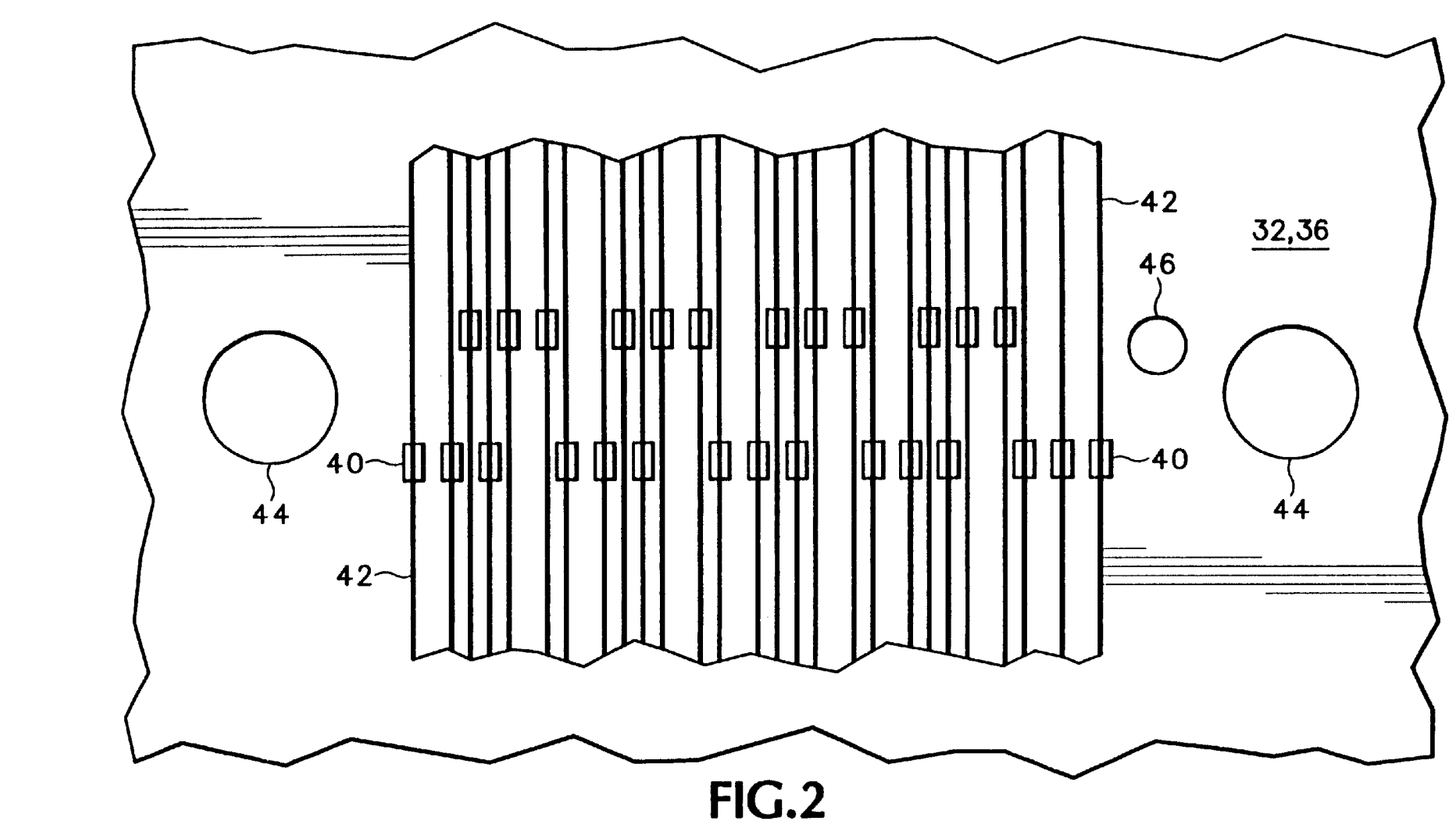
FIG. 2 is a closeup view of the signal contact pads on the device under test that mate with signal contacts of the multi-channel, low input capacitance signal probe according to the present invention.

Referring to FIG. 2, there is shown a closeup view of the signal contact pads 40 on the device under test 12 that mate with signal contacts of the multi-channel, low input capacitance signal probe head 30. Conductive runs 42 are laid down on the circuit board 32, 36 to couple a bus or busses on the device under test 12 to the contact pads 40. The signal contact pads 40 are formed in an array on a circuit board 32, 36 with the array having two rows of contact pads in the preferred embodiment. One row of the array has four sets of three contact pads and the other row has five sets of three contact pads. Each set of contact pads has two signal pads separated by a ground contact pad for a total of eighteen signal contact pads. One pair of the signal contact pads are used for providing positive and negative differential clock signal leaving a total of sixteen signal contact pads used as data channels. The signal contact pads may be configured as sixteen single ended data channels or combined in pairs as eight differential signal channels. In the preferred embodiment of the invention, through holes 44 are formed in the circuit board 32, 36 on either side of the array of contact pads 40 for accepting a probe head retention member to be described in greater detail below. An orientation aperture 46 may also be formed in the circuit board 32, 36 for accepting an orientation pin on the signal probe head 30. Alternately, the probe head retention member may include stakes extending from the circuit board that are received in the multi-channel, low input capacitance signal probe head 30.

Figure 3:
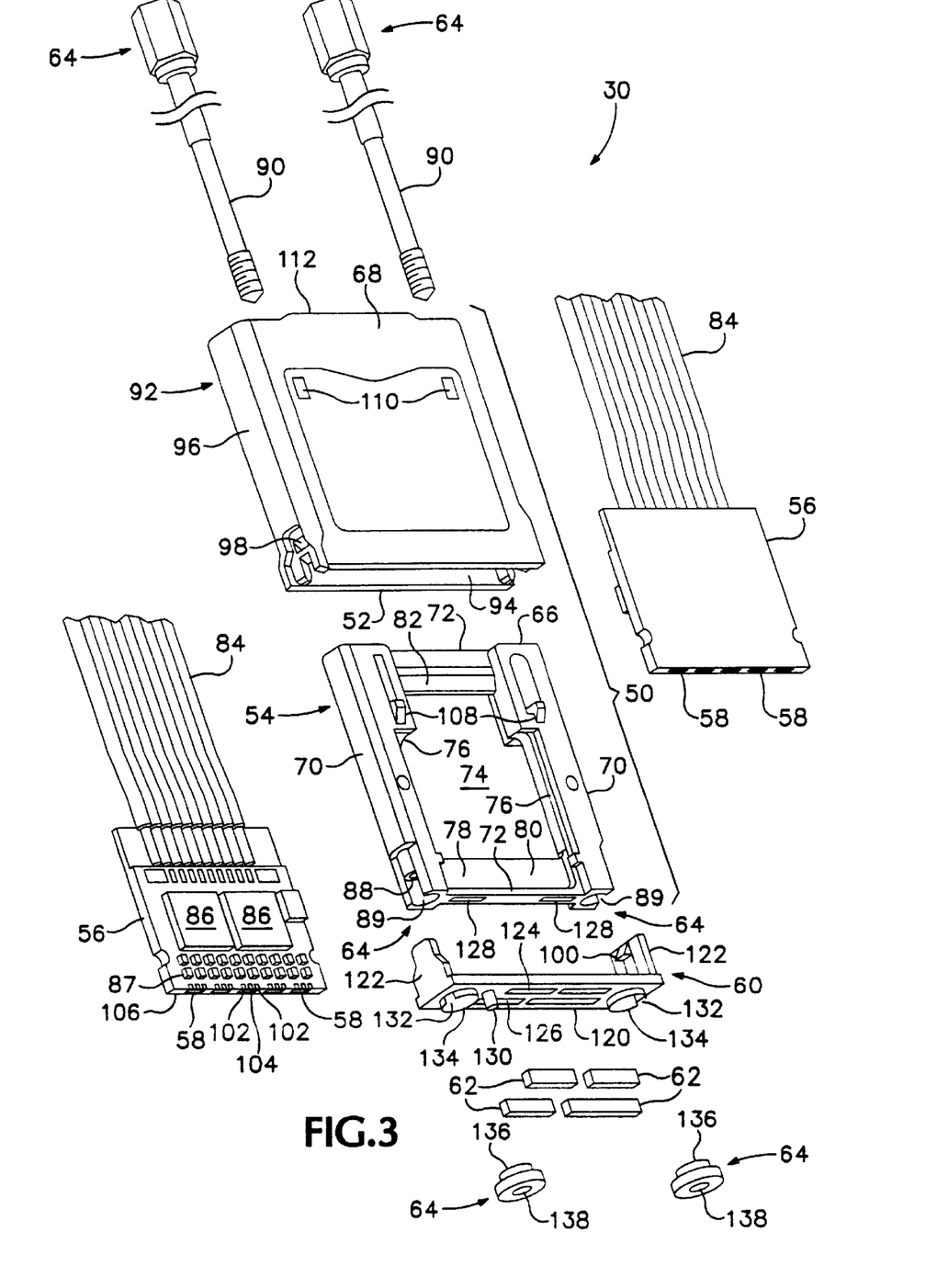
FIG. 3 is an exploded perspective view of a first embodiment of the multi-channel, low input capacitance signal probe head according to the present invention.

The multi-channel, low input capacitance signal probe head 30, as shown in the exploded perspective view of FIG. 3, includes a housing 50 having at least a first open end 52 and a substrate support member 54 that receives at least a first substrate 56. The substrate 56 has a plurality of input signal pads 58 formed thereon that are exposed at one end of the substrate 56. The substrate 56 is positioned in the housing 50 such that the input signal pads 58 are exposed at the open end 52 of the housing 50. A removable signal contact holder 60 mounts to the housing 50 and supports electrically conductive elastomer signal contacts 62. The holder 60 is positioned over the open end 52 of the housing 50 such that the elastomer signal contacts 62 engage the input signal pads 58 on the substrate. A probe head retention member 64 that has a portion formed in the housing 50 secures the signal probe head 30 to a device under test 12.

The housing 50 of the signal probe head 30 has a substrate carrier 66 and cover 68. The substrate carrier 66 is preferably formed of opposing stiles 70 and rails 72 forming an open region 74 there between similar in form to a window sash. At least a first set of recesses 76 are formed in the stiles adjacent to the open region 74. At least a first set of recesses 78 are also formed in the rails 72 with the recess 80 on one of the rails matching the recesses 76 on the stiles 70. The recess 82 on the other rail is sized to accept a high frequency ribbon cable 84 connected to the substrate 56. The matching recesses 76,80 on the substrate carrier 66 receive the substrate 56, preferably a hybrid substrate having electrical components, such as integrated circuits 86 and passive components 87, mounted thereon forming input signal circuits. In the preferred embodiment of the invention, the stiles 70 and rails 72 have recesses 76, 78 formed on both sides for receiving opposing hybrid substrates 56. A bore 88 is formed through each of the stiles 70 parallel to the long axis of the stiles and parallel with the substrates. The bores 88 receive attachment members 90 to secure the signal probe head 30 to the circuit board 32, 36 of the device under test 12. Second bores 89 are formed in the stiles that extend from the open end 52 of the housing 50 and are coaxial with the first bores 88. Each second bore 89 has a diameter larger than the first bore 88 and sized to closely receive an alignment flange to be described in greater detail below. The attachment members 90 are preferably threaded screws that are received in threaded apertures disposed on the opposite side of the circuit board 32, 36 from the array of signal contact pads 40. The substrate carrier 66 is preferably made of a rigid material, such as a liquid crystal polymer, for transferring the column loading on the carrier produced by the attachment member 90 to the circuit board. The cover 68 is preferably made of a nylon plastic and has exterior walls 92 forming a cavity 94 that closely receives the substrate carrier 66. The narrow opposing walls 96 of the cover have apertures 98 formed adjacent to one end that receive latching ramps 100 on a removable signal contact holder 60.

Alternately, the housing 50 may be a clam-shell type design. The housing has a first housing member having a base and sidewalls extending from at least one side of the base forming an open ended cavity. A support frame may be formed around the periphery of the interior portion of the base to support the substrate off of the base. Bores may be formed in the sidewalls of the base parallel with the substrate. The bores receive the attachment members to secure the signal probe head to the circuit boars of the device under test. A second housing member having a periphery coextensive with the shape of the first housing member is secured to the first housing member to enclose the substrate in the housing. The sidewalls of the first housing member may also extend from both sides of the base forming open ended cavities on both sides of base. Support frames may be formed around the periphery of the interior portions on both sides of the base to support the substrates on both sides of the base. Second housing members having a periphery coextensive with the shape of the first housing member are secured to the first housing member to enclose the substrates in the housing.

Each hybrid substrate 56 has a plurality of input signal pads 102 and ground pads 104 formed on one end surface 106 of the substrate 56 corresponding to the sets of signal contact pads 40 on the device under test 12. Each of the input signal pads 102 is electrically coupled to an input signal circuit in the form of a buffer amplifier formed in the integrated circuit 86 mounted on the substrate 56. The substrates 56 are positioned in the substrate carrier 66 with the substrate circuitry facing each other and the input signal pads 58 exposed at the end of the carrier 66. The individual signal lines of the ribbon cable 84 are electrically coupled to the outputs of the buffer amplifier circuitry 86. With the ribbon cables 84 attached to the substrate 56 and the substrate 56 positioned in the carrier 66, the cover 68 is slipped over the carrier 66 and held in place by latching ribs 108 on the carrier engaging latching apertures 110 in the cover. The input signal pads 58 on the substrate 56 are then exposed at the open end of the housing 52 with the ribbon cable 84 extending from the opposite end 112 of the housing 50.

The open end 52 of the housing 50 receives the removable signal contact holder 60 that is affixed to the housing 50. The signal contact holder 60 has a planar frame member 120 and latching members 122 extending in the same direction from either end of the frame member 120. At least a first slot 124 is formed in the frame member 120 that is aligned with the end of the substrate 56 in the housing 50. A second slot 126 is formed in the frame member 120 when the signal probe head 30 includes two substrates 56 that is aligned with the end of the second substrate. In the preferred embodiment of the invention, slots 124 and 126 are divided into two co-linear slots. Alignment ribs (not shown) are formed in the frame member 120 that align with corresponding alignment grooves 128 formed in the exposed end of the substrate carrier 66. The latching members 122 have inwardly facing latching ramps 100 that engage the aperture 98 in the housing 50 to secure the signal contact holder 60 over the open end 52 of the housing 50. An orientation pin 130 may be formed on the opposite side of the frame member 120 from the latching members 122 that is received in the orientation aperture 46 in the circuit board 32, 36 to aid in the proper orientation of signal probe head 30. The slot or slots 124, 126 in the frame member 120 receive and support the electrically conductive elastomer signal contacts 62 that engage the input signal pads 58 on the substrate or substrates 56. The electrically conductive elastomer signal contacts 62 are formed from a sheet of electrically conductive elastomer material having a center conductive elastomer region sandwiched between outer insulating elastomer regions. The conductive elastomer region has gold wires extending through the elastomer material at a 0.002 inch pitch. Such a conductive elastomer is commercially available under the name of MAF Inter-connect from Shin-Etsu Polymer America, Inc. of Union City, Calif. The sheet of electrically conductive elastomer material is sliced to a length that closely fits the slot or slots 124, 126 of the signal contact holder 60. The height of the elastomer material is slightly larger than the thickness of the frame member 120 of the holder 60 so that the downward force of the attachment members 90 on the housing 50 compresses the electrically conductive elastomer signal contacts 62 between the signal contact pads 40 on the circuit board 32, 36 and the input signal pads 58 on the substrate 56. The removable signal contact holder 60 also includes apertures 132 formed on either side of the electrically conductive elastomer signal contacts 62 that are aligned with the bores 88 in the housing 50.

The multi-channel, low input capacitance signal probe head replaces the high frequency, controlled impedance connector system currently in use with the electrically conductive elastomer signal contacts 62. The elastomer signal contacts 62, in conjunction with the structure of the signal probe head that places the input signal contacts 58 at the end of the housing 50, produces a low input capacitance signal probe head 30 having an input capacitance of approximately 0.7 picofarads. Reducing the input capacitance of signal probe head from 2 to 2.5 picofarads to 0.7 picofarads is essential for testing busses and circuits operating in the gigahertz range. The electrically conductive elastomer signal contacts 62 will loss their elasticity over time resulting in intermittent or loss of connectivity between the signal contact pads 40 on the device under test 12 and the input signal pads 58 on the substrate. The incorporation of the removable signal contact holder 60 in the multi-channel, low input capacitance signal probe head 30 also allows quick and easy replacement of the elastomer signal contacts 62 of the signal probe head 30.

The present embodiment of the signal probe head 30 is designed for circuit boards having a thickness of 0.090 inches or greater. In this embodiment, flanges 134 are formed adjacent to the apertures 132 formed in the signal contact holder 60 in a direction opposite the latching members 122. The flanges 134 closely fit the through holes 44 formed in the circuit board 32, 36 on either side of the signal contact pads 40 on the circuit board. The flanges 134 help align the signal probe head 30 onto the signal contact pads 40. The probe head retention member 64 includes retention nuts 136 secured to the opposite side of the circuit board from the signal contact pads 40. Each retention nuts 136 has a threaded aperture 138 that is aligned with one of the through holes 44 on either side of the signal contact pads 40. In the preferred embodiment, the retention nuts are PEM nuts, manufactured and sold by Penn Engineering & Manufacturing Corp., Danboro, Pa. under Part No. KF2-256. The threaded screw attachment members 90 threadably engage the retention nuts 136 to secure the signal probe head 30 to the circuit board 32, 36.

Figure 4:
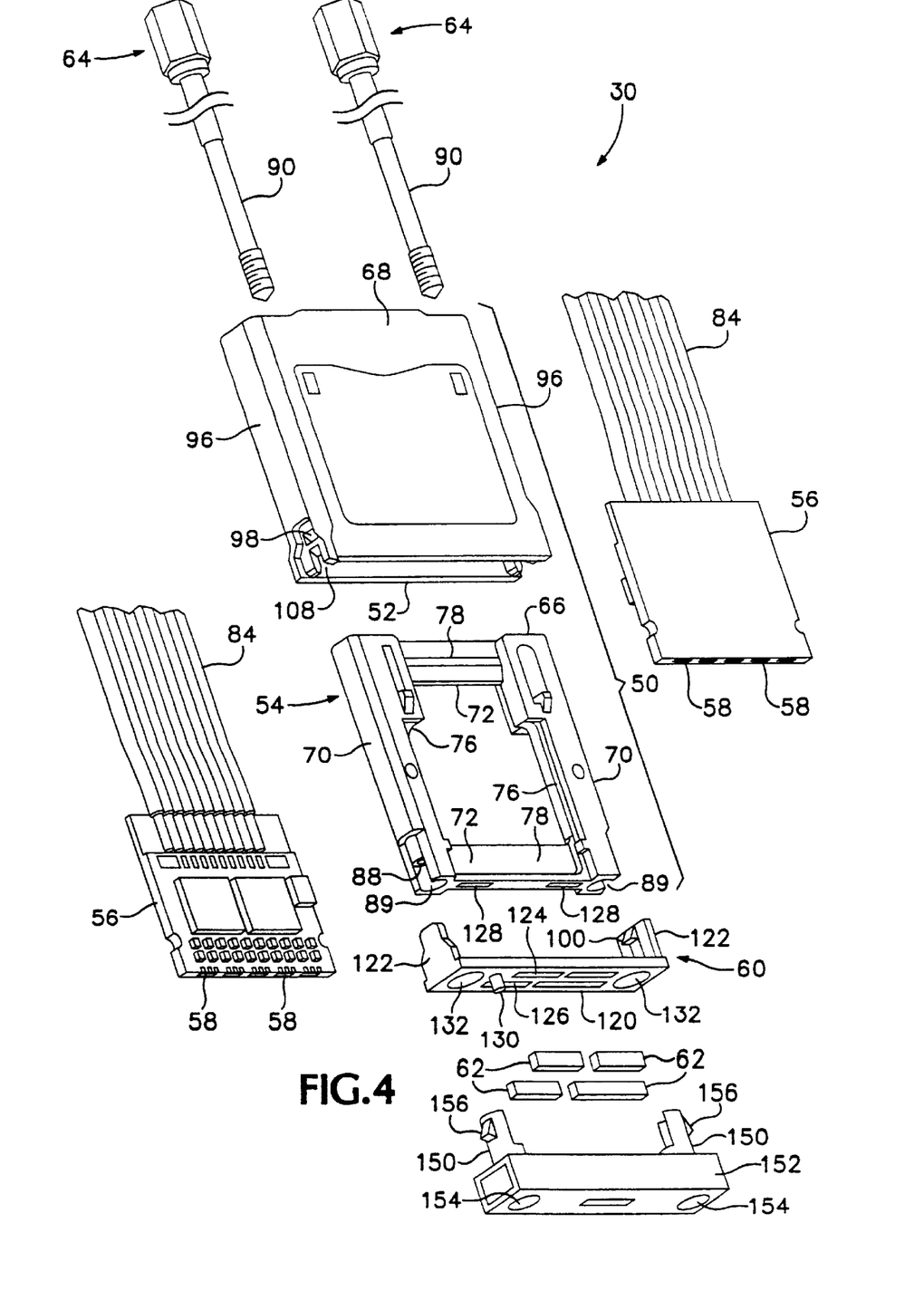
FIG. 4 is an exploded perspective view of a second embodiment of the multi-channel, low input capacitance signal probe head according to the present invention.

FIG. 4 is an exploded perspective view of a second embodiment of the multi-channel, low input capacitance signal probe head 30 according to the present invention. Like elements in FIG. 3 are labeled the same in FIG. 4. The housing 50 of the second embodiment is the same as in FIG. 3 with the housing 50 having a substrate carrier 66 and cover 68. The substrate carrier 66 includes the stiles 70 and rail 72 configuration with the stiles and rails having the recesses 76, 78 formed therein to receive the hybrid substrate or substrates 56. The stiles 70 include the bores 88 that receive the attachment member 90. The substrate carrier 66 is closely received in the cover 68 with the narrow opposing walls 96 of the cover 68 having apertures 98 formed adjacent to one end that receive latching ramps 100 on a removable signal contact holder 60. The alternative configuration of the housing previously described may also be used in the second embodiment.

The removable signal contact holder 60 is affixed to the housing over the open end 52 of the housing 50 having the exposed signal contact pads 58 of the hybrid substrate or substrates 56. The signal contact holder 60 is configured with the planar frame member 120 having the latching members 122 extending in the same direction from either end of the frame member 120. The electrically conductive elastomer signal contacts 62 are received and supported in the slot or slots 124, 126 aligned with the ends of the substrate or substrates 56. The frame member 120 includes the alignment ribs (not shown) that are aligned with the corresponding alignment grooves 128 formed in the exposed end of the substrate carrier 66. The latching members 122 have the inwardly facing latching ramps 100 that engage the aperture 98 in the housing 50 to secure the signal contact holder 60 over the open end 52 of the housing 50. The orientation pin 130 may also be formed on the opposite side of the frame member 120 from the latching members 122 that is received in the corresponding orientation aperture 46 in the circuit board 32, 36 to aid in the proper orientation of signal probe head 30. The removable signal contact holder 60 also includes the apertures 132 formed on either side of the electrically conductive elastomer signal contacts 62 that are aligned with the bores 88 in the housing 50.

The present embodiment of the signal probe head 30 is designed for circuit boards having a thickness of less than 0.090 inches. In this embodiment, the flanges 134 formed adjacent to the apertures 132 in the signal contact holder 60 are removed and replaced by alignment flanges 150 extending above the circuit board 32, 36. The alignment flanges 150 extend from a retention block 152 that is positioned on the opposite side of the circuit board 32, 26 from the contact pads 40. The retention block 152 has threaded apertures 154 formed therein that are aligned with the through holes 44 in the circuit board 32, 36. The alignment flanges 150 are formed adjacent to the threaded apertures 154 and are sized to be closely receives in the through holes 44 in the circuit board 32, 36. The flanges 150 extend above the surface of the circuit board 32, 36 and include latching members 156 that extend outward from the flanges 150 and engage the top surface of the circuit board 32, 36 to secure the retention block 152 to the circuit board. The signal probe head 30 is positioned on the circuit board 32, 26 with the flanges 150 extending into the second bores 89 in the housing 50 to help align the signal probe head 50 on the board. The latching members 156 of the retention block 152 are closely received in notches 158 formed adjacent to the open end 52 of the housing 50. The attachment members 90, in the form of the threaded screws positioned in the bores 88 of the housing 50, threadably mate with the threaded apertures 154 in the retention block 152. Tightening of the threaded screws 90 in the retention block 152 captures the circuit board 32, 36 between the retention block 152 and the signal probe head 30 and secures the signal probe head 30 to the circuit board 32, 36.

Figures 5, 7:
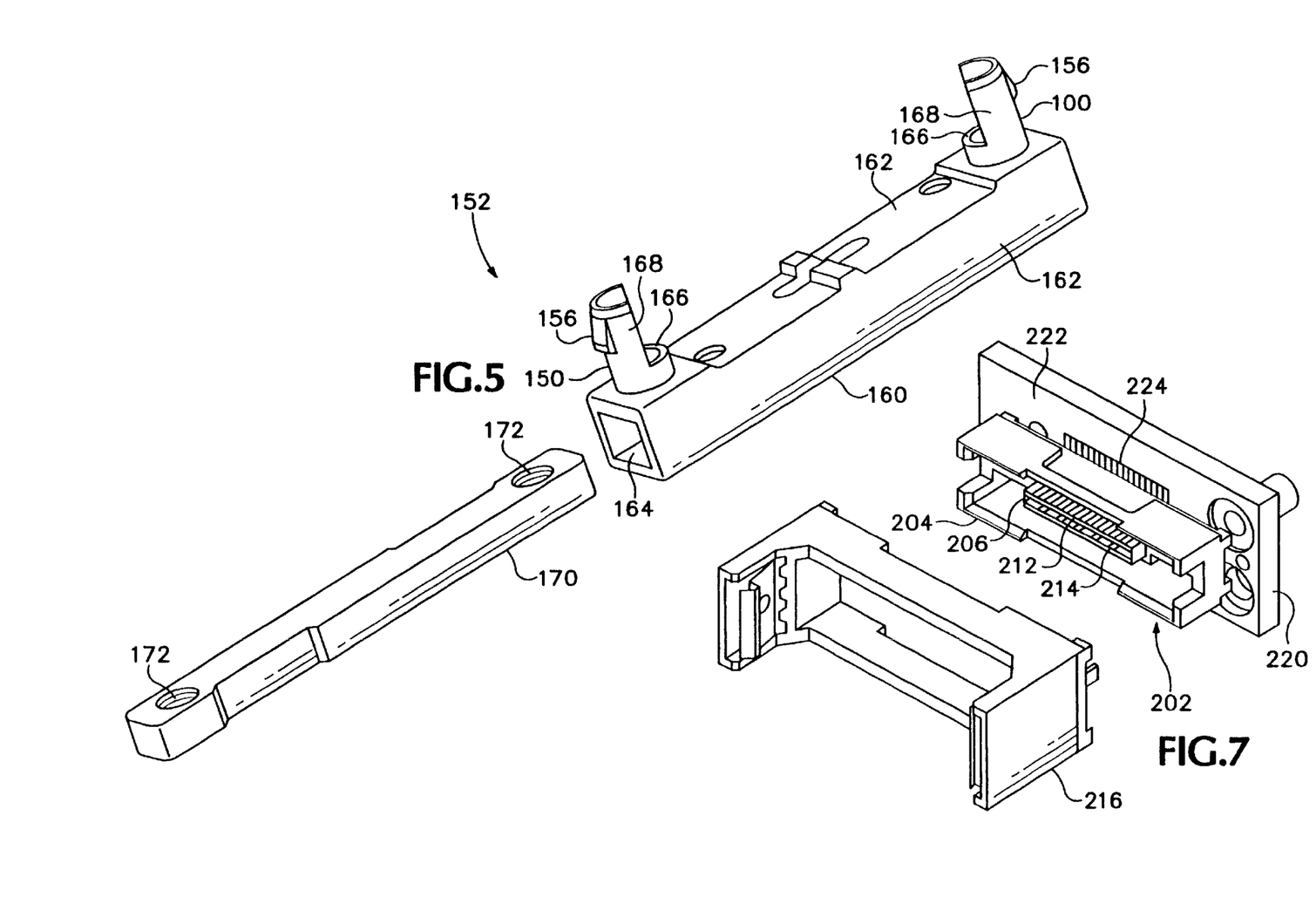
FIG. 5 is an exploded perspective view of the preferred embodiment of the retention block in the multi-channel, low input capacitance signal probe head according to the present invention.
FIG. 7 is a top perspective view of the receptacle portion of the multi-channel, controlled impedance connector used with the first adapter.

FIG. 5 shows an exploded perspective view of the preferred embodiment of the retention block 152. The retention block 152 has rectangular housing 160 with exterior walls 162 forming an interior chamber 164. The housing has apertures 166 formed on one of the exterior walls 162 that align with the through holes 44 in the circuit board 32, 36. The alignment flanges 150 extend from the exterior wall 162 adjacent to the apertures 166. The exterior surface 168 of the apertures 150 closely mate with and extend through the through holes 44 in the circuit board 32,36. The alignment flanges 150 have the outwardly extending latching members 156 that engage the top surface of the circuit board 32, 36. A stiffener block 170, such as made of brass or other similar hard material, is positioned in the interior chamber 164 of the rectangular housing 160. The stiffener block 170 has threaded apertures 172 formed therein that are aligned with the apertures 166 in the rectangular housing 160 that receive the attachment members 90 to secure the signal probe head 30 to the circuit board 32, 36.

Figure 6:
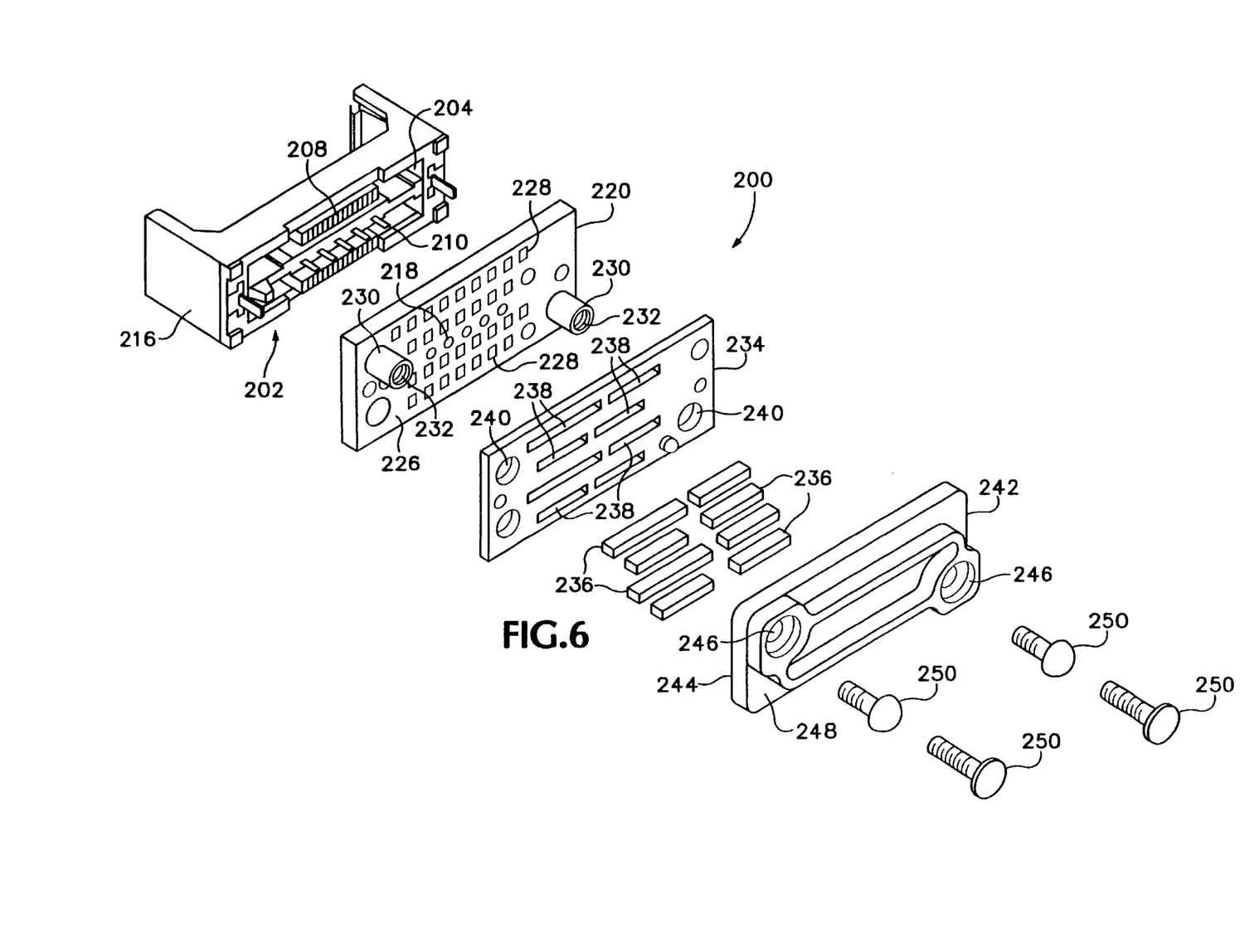
FIG. 6 is an exploded perspective view of a first adapter usable with the configuration of signal contact pads on the device under test of the multi-channel, low input capacitance signal probe of the present invention and existing multi-channel signal probes.

Backward compatibility needs to be maintained between existing multi-channel signal probes using mictor or similar type connectors and the new configuration of signal contact pads 40 on the device under test 12 used with the multi-channel, low input capacitance signal probe 26 of the present invention. There also needs to be compatibility between mictor or similar type connectors mounted on the device under test and the multi-channel, low input capacitance signal probe 26 of the present invention. In this regard, FIG. 6 is an exploded perspective view of a first adapter 200 usable with existing multi-channel signal probes and the new configuration of signal contact pads 40 on the device under test 12. The existing multi-channel signal probe has a probe head that is terminated with the plug portion of the high speed, controlled impedance connector (e.g. mictor connector or the like). The connector has plug portion that closely mates with a receptacle portion 202 (FIGS. 6 and 7) with each portion having a housing 204 enclosing the transmission lines 206. As previously described, the ends of the transmission lines extending from one end of the housing in the plug portion are formed as parallel rows of edge connected contact pads coupled to electrical circuitry in the probe head. The ends of the transmission lines extending from the other end of the housing are formed as parallel rows of electrical contacts separated by the center power ground corrugated planar structure contact. The ends of the transmission lines 206 extending from one end of the housing of the receptacle portion 202 are formed as parallel rows of contact pads 208 on either side of center power ground contacts 210. The ends of the transmission lines 206 extending from the other end of the housing 204 are formed as parallel rows of electrical contacts 212 separated by the center power ground contacts 214. The electrical contacts and the center power ground contacts engage each other when the plug is inserted into the receptacle. The receptacle housing 204 may be inserted into a latching housing 216 prior to attaching the receptacle 202 to the circuit board 32, 36 of the device under test 12. While it is general practice to terminate the multi-channel signal probes with the plug portion of the connector, the adapter of the present invention may equally be implemented with the receptacle portion of the connector terminating the signal probe.

The adapter 200 has the other portion of the mating receptacle portion 202 of the connector which is mounted on a substrate 220. The substrate 220 has a top surface 222 on which is formed an array of contact pads 224 corresponding to the contact pads 208 of the transmission lines 206 of the receptacle 202. Through holes 218 are provided in the substrate 220 for receiving the power-ground contacts 210. The contact pads 208 of the receptacle 202 are affixed to the contact pads 224 on the substrate 220 using well known connecting techniques, such as soldering, glueing with an electrically conductive adhesive or the like, to electrically couple the receptacle contact pads to the substrate contact pads. The bottom surface 226 of the substrate 220 has a second array of contact pads 228 corresponding to the signal contact pads 40 on the circuit board 32, 36 of the device under test 12. Conductive runs (not shown) extend through the substrate 220 to couple the array of contact pads 224 on the top surface 222 with the array of contacts pads 228 on the bottom surface 226.

The adapter is preferably configured with mounting lugs 230 extending from the bottom surface 226 of the substrate 220. The lugs 230 are circular in form and have threaded apertures 232 formed therein. The lugs 230 are positioned on the substrate 220 and aligned with the through holes 44 in the circuit board 32, 36 adjacent to the signal contact pads 40.

A removable signal contact holder 234 is positioned adjacent to the bottom surface 226 of the substrate 220 that support electrically conductive elastomer signal contacts 236. The contact holder 234 has slots 238 formed therein that align with the second array of contact pads 228 on the bottom surface of the substrate 220. Apertures 240 are formed in the contact holder 234 that align with the lugs 230 mounted on the bottom of the substrate 220. The slots 238 receive and support the electrically conductive elastomer signal contacts 236 that engage the contact pads 228 on the bottom surface of the substrate 220. The electrically conductive elastomer signal contacts 236 are formed from the same electrically conductive elastomer sheet material as used in forming the electrically conductive elastomer signal contacts 62 of the multi-channel, low input capacitance signal probe head 30. The height of the elastomer material is slightly larger than the thickness of the holder 234 so that downward force of the adapter 200 on the circuit board 32, 36 of the device under test 12 compresses the electrically conductive elastomer signal contacts 236 between the signal contact pads 40 on the circuit board 32, 36 and the contact pads 228 on the substrate 220. The removable signal contact holder 234 is positioned on the adapter 200 by inserting the holder over the lugs 230.

An adapter retention member 242 is positioned on the opposite side of the circuit board 32, 36 from the signal contact pads 40 of the device under test 12 to aid in securing the adapter 200 to the device under test 12. The retention member 242 is preferably rectangular in shape having a substantially planar top surface 244 that engages the bottom surface of the circuit board 32, 36. Apertures 246 are formed in the retention member 242 that align with the through holes 44 formed in the circuit board 32, 36 adjacent to the signal contact pads 40. A portion of the aperture extending from the top surface of the retention member is bored with a slightly larger diameter to closely receive the lugs on the adapter substrate. A portion of the aperture 246 extending from the bottom surface 248 of the retention member 242 is bored with a slightly larger diameter to receive an attachment member 250 that extends into the threaded apertures 232 of the lugs 230. The attachment members 250 are preferably threaded screws that when tightened capture the circuit board 32, 36 of the device under test 12 between the removable signal contact holder 234 and the adapter retention member 242. The shorter of the threaded screws 250 are used with circuit boards having a thickness of 0.090 inches or less and the longer of the threaded screws are used for circuit boards having a thickness greater than 0.090 inches.

Figure 8:
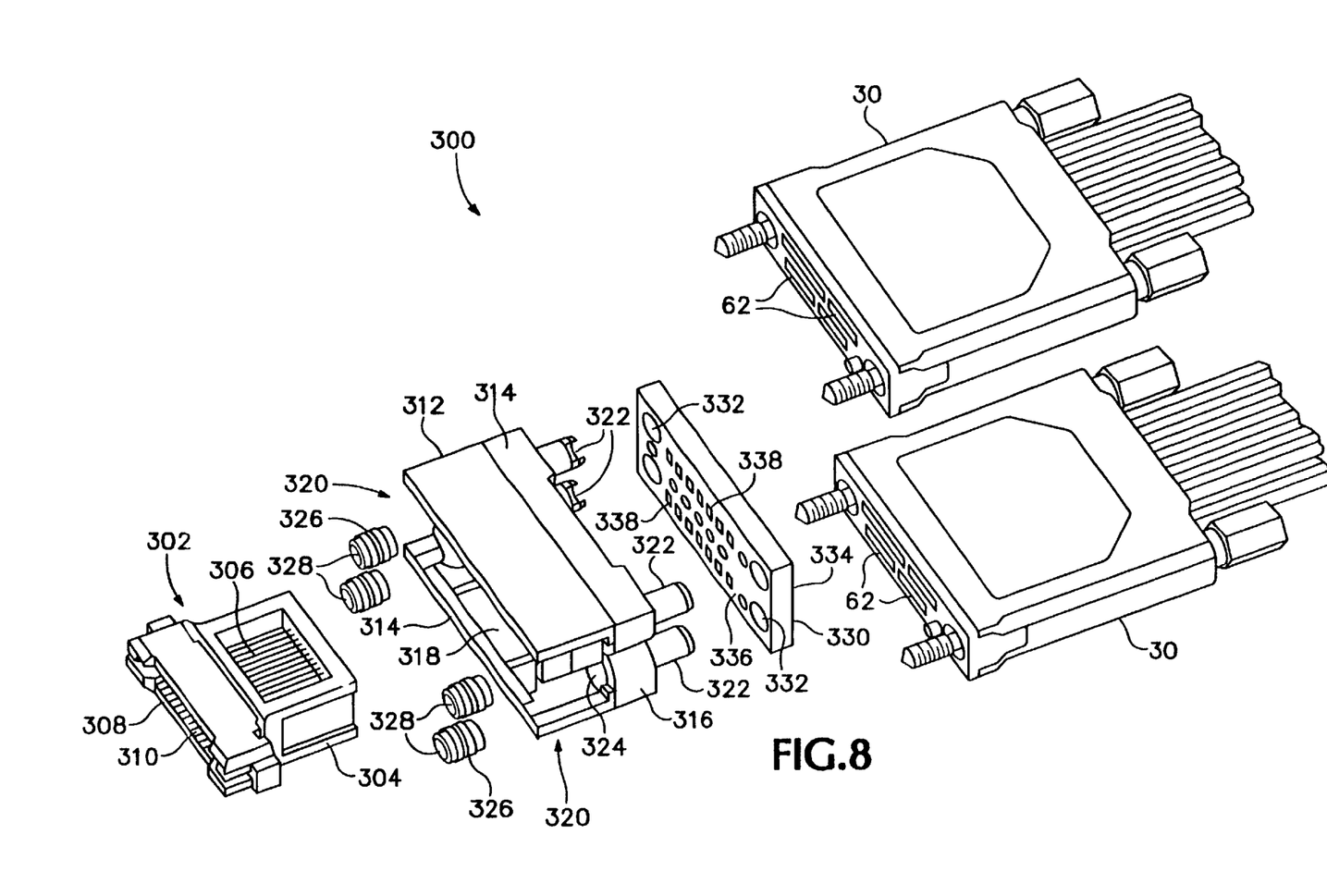
FIG. 8 is an exploded perspective view of a second adapter usable with the multi-channel, low input capacitance signal probe of the present invention and existing high speed connectors mounted on the device under test.

FIG. 8 is an exploded perspective view of a second adapter 300 for connecting the multi-channel, low input capacitance signal probe or probes 30 to a mictor or similar type connector mounted on the device under test 12. The connector has closely mating plug 302 and receptacle portions with each portion having a housing 304 enclosing the transmission lines 306. The transmission lines 306 extending from one end of the housing 302 of the plug portion are formed as parallel rows of contact pads on either side of center power ground contacts. The ends of the transmission lines 306 extending from the other end of the housing 304 are formed as parallel rows of electrical contacts 308 separated by the center power ground corrugated planar structure contact 310. The ends transmission lines extending from one end of the housing of the receptacle portion are formed as parallel rows of contact pads on either side of center power ground contacts. The ends of the transmission lines extending from the other end of the housing are formed as parallel rows of electrical contacts separated by the center power ground contacts. The electrical contacts and the center power ground contacts engage each other when the plug is inserted into the receptacle. While it is general practice to connect the receptacle portion of the connector on the circuit board of the device under test, the adapter of the present invention may equally be implemented with the plug portion of the connector mounted on the circuit board.

The adapter 300 has a housing 312 with opposing end walls 314 and sidewalls 316 forming a cavity 318 that receives the other of the closely mating plug 302 or receptacle. The contact pads of the transmission lines 306 are exposed at one end of the housing cavity 318 and the electrical contacts 308 of the transmission lines are exposed at the other end of the housing. The housing 312 has probe head retention members 320 formed in the sidewalls 316 on either side of the cavity 318 and alignment flanges 322 disposed adjacent to the probe head retention members 320 that extend upward from the sidewalls 316. The retention members 320 include bores 324 formed in the sidewalls with the bores receiving pins 326 having a threaded aperture 328 formed therein.

The adapter includes a substrate 330 having apertures 332 formed therethrough that closely receive the alignment flanges 322 on the housing 312. The substrate 330 has top and bottom surfaces 334, 336 with the top surface having a first array of contact pads (not shown) corresponding to the elastomer signal contacts 62 of the multi-channel, low input capacitance signal probe head 30. The bottom surface 336 of the substrate 330 has a second array of contact pads 338 disposed thereon in a pattern corresponding to the contacts pads of the transmission lines. The contact pads of the transmission lines are affixed to the second array of contact pads using well known connecting techniques, such as soldering, glueing with an electrically conductive adhesive or the like, to electrically couple the plug contact pads to the substrate contact pads. The first array of contact pads on the top surface of the substrate are electrically coupled to the corresponding second array of contact pads on the bottom surface of the substrate via conductive runs (not shown) extending through the substrate 330.

The alignment flanges 322 mate with the corresponding bores 89 in the multi-channel, low input capacitance signal probe head 30 such that the elastomer signal contacts 62 of the multi-channel, low input capacitance signal probe head 30 connect to corresponding contact pads on the top surface 334 of the substrate 330. The threaded pins 326 of the probe head retention members 320 receive the attachment members 90 disposed in the bores 88 of the multi-channel, low input capacitance signal probe head 30 to secure the probe head to the housing 312.

The adapter of FIG. 8 illustrates the preferred implementation of the adapter that allows two multi-channel, low input capacitance signal probe heads 30 to be connected to the adapter 300. In this configuration, additional probe head retention members 320 are formed in the sidewalls 316 adjacent to the first probe head retention members 320 and alignment flanges 322 are disposed adjacent to the additional probe head retention members 320 that extend upward from the sidewalls 316. The additional alignment flanges 322 mate with the corresponding bores 88 in the other multi-channel, low input capacitance signal probe head 30. The other multi-channel, low input capacitance signal probe head 30 is secured to the housing in the same manner as the first using the attachment members 90 previously described.

A multi-channel, low input capacitance signal probe and probe head has been described having one or more substrates with each substrate having a plurality of input signal pads formed and exposed at one end of the substrate. The substrate or substrates are positioned in a housing having at least a first open end and a substrate support member that receives the substrate or substrates such that the input signal pads are exposed at the open of the housing. A removable signal contact holder mounts to the housing and supports electrically conductive elastomer signal contacts. The holder is disposed over the open end the housing such that the elastomer signal contacts engage the input signal pads. The input signal pads on the substrate are electrically coupled to signal lines of a multiple signal lines cable. The other ends of the signal lines are electrically coupled to an input connector for coupling to the measurement instrument.

The multi-channel, low input capacitance signal probe attaches to a device under test having an array of signal contact pads on at least one surface of a circuit board corresponding to the electrically conductive elastomer signal contacts. Through holes are formed on either side of the array of signal contact pads for receiving a probe head retention member that secures the signal probe head to the device under test. The probe head retention member has attachment members extending through bores in the housing that threadably mate with retention nuts or a retention block having threaded apertures formed therein mounted to the opposite side of the circuit board from the contact pads.

First and second adapters have also been described that connect existing multi-channel signal probes having multi-channel, controlled impedance transmission line connectors to the new configuration of signal contact pads on the device under test used with the multi-channel, low input capacitance signal probe of the present invention, and existing multi-channel, controlled impedance transmission line connectors mounted on a device under test to the multi-channel, low input capacitance signal probe of the present invention. The first adapter has one of the mating plug or receptacle portions of the connector which is mounted on a substrate. The substrate has first and second arrays of contact pads formed on the respective top and bottom surfaces of the substrate. The first array of contact pads are affixed to corresponding contact pads of the transmission lines of the plug or receptacle. The second array of contact pads correspond to the signal contact pads on the device under test. Conductive runs extend through the substrate to connect the first and second array together. A removable signal contact holder is positioned adjacent to the bottom surface of the substrate. The contact holder supports electrically conductive elastomer signal contacts that electrically couple the second array of contact pads to the signal contact pads on the device under test. Mounting lugs extend from the bottom surface of the substrate that receive the signal contact holder. The lugs are positioned in the through holes formed in the circuit board of the device under test. The adapter is secured to the device under test using an adapter retention member that is positioned on the opposite of the circuit board from the signal contact pads. Threaded screw attachment members are received in threaded apertures in the lugs that when tightened compress the electrically conductive elastomer signal contacts between the second array of contact pads on the substrate and the signal contact pads on the circuit board of the device under test and secure the adapter to the circuit board.

The second adapter has a housing with opposing end walls and sidewalls forming a cavity that receives the other of the closely mating plug or receptacle. The contact pads of the transmission lines of the closely mating plug or receptacle are exposed at one end of the housing cavity and the electrical contacts of the transmission lines are exposed at the other end of the housing. The housing has probe head retention members formed in the sidewalls on either side of the cavity and alignment flanges disposed adjacent to the probe head retention members that extend upward from the sidewalls. The retention members include bores formed in the sidewalls with the bores receiving pins having a threaded aperture formed therein.

The adapter includes a substrate having apertures formed therethrough that closely receive the alignment flanges on the housing. The substrate has first and second arrays of contact pads formed on the respective top and bottom surfaces of the substrate. The first array of contact pads correspond to the electrically conductive elastomer signal contacts of the multi-channel, low input capacitance signal probe head The second array of contact pads correspond are affixed to corresponding to the contact pads of the transmission lines of the plug or receptacle. The first array of contact pads on the top surface of the substrate are electrically coupled to the corresponding second array of contact pads on the bottom surface of the substrate via conductive runs extending through the substrate.

The alignment flanges mate with corresponding bores in the multi-channel, low input capacitance signal probe head such that the signal contact pads of the multi-channel, low input capacitance signal probe head connect to corresponding contact pads on the top surface of the substrate. The threaded pins of the probe head retention members receive attachment members, such as threaded screws, disposed in the bores of the multi-channel, low input capacitance signal probe head to secure the probe head to the housing.

It will be obvious to those having skill in the art that many changes may be made to the details of the above-described embodiments of this invention without departing from the underlying principles thereof. The scope of the present invention should, therefore, be determined only by the following claims.

What is claimed is:

1. An adapter for coupling a multi-channel, low input capacitance signal probe head having input signal contact pads to a connector having one of a closely mating plug and receptacle mounted on a circuit board of a device under test with the plug and receptacle having high speed, controlled impedance transmission lines disposed within respective housings with one end of the transmission lines forming contact pads at one end of the housings and the other end of the transmission lines forming electrical contacts at the other end of the housings with the electrical contacts engaging each other on mating of the plug and receptacle, the adapter comprising:

the other of the closely mating plug and receptacle;

a housing having opposing end walls and sidewalls forming a cavity that receives the other of the closely mating plug and receptacle such that the contact pads of the transmission lines are exposed at one end of the housing and the electrical contacts of the transmission lines are exposed at the other end of the housing, the housing having probe head retention members formed in the sidewalls and alignment flanges disposed adjacent to the probe head retention members and extending upward from the sidewalls;

a substrate having top and bottom surfaces with the top surface having a first array of contact pads corresponding to the input signal contacts of the multi-channel, low input capacitance signal probe head and the bottom surface having a second array of contact pads disposed thereon in a pattern corresponding to the contacts pads of the transmission lines of the other of the closely mating plug and receptacle with the contact pads on the top surface being electrically coupled to corresponding contact pads on the bottom surface and the substrate having apertures formed therethrough that closely receive the alignment flanges on the housing with the contact pads of the transmission lines being affixed to the second array of contact pads; and the alignment flanges mating with corresponding bores in the multi-channel, low input capacitance signal probe head such that the signal contact pads of the multi-channel, low input capacitance signal probe head connect to corresponding contact pads on the top surface of the substrate with and the probe head retention members receiving attachment members disposed in the bores of the multi-channel, low input capacitance signal probe head to secure the probe head to the housing.

2. The adapter as recited in claim 1 wherein the probe head retention members further comprises bores formed in the sidewalls with the bores receiving pins having a threaded aperture formed therein.

3. The adapter as recited in claim 1 wherein the housing further comprises additional probe head retention members formed in the sidewalls adjacent to the first probe head retention members and alignment flanges disposed adjacent to the additional probe head retention members and extending upward from the sidewalls with the alignment flanges mating with corresponding bores in another multi-channel signal probe head with the probe head retention member receiving attachment members disposed in the bores of the other multi-channel signal probe head to secure the probe head to the housing.

4. The adapter as recited in claim 3 wherein the additional probe head retention members further comprises bores formed in the sidewalls with the bores receiving pins having a threaded aperture formed therein.

* * * * *